(12) United States Patent
Iwase

(10) Patent No.: US 9,720,448 B2
(45) Date of Patent: Aug. 1, 2017

(54) DISPLAY UNIT AND ITS MANUFACTURING METHOD

(71) Applicant: JOLED INC., Tokyo (JP)

(72) Inventor: Yuichi Iwase, Kanagawa (JP)

(73) Assignee: Joled Inc., Tokyo (JP)

( * ) Notice: Subject to any disclaimer, the term of this patent is extended or adjusted under 35 U.S.C. 154(b) by 0 days.

(21) Appl. No.: 14/560,114

(22) Filed: Dec. 4, 2014

(65) Prior Publication Data
US 2015/0085211 A1    Mar. 26, 2015

Related U.S. Application Data

(60) Continuation of application No. 14/299,609, filed on Jun. 9, 2014, which is a continuation of application No. 11/689,140, filed on Mar. 21, 2007, now Pat. No. 8,808,477, which is a division of application No. 10/674,255, filed on Sep. 29, 2003, now Pat. No. 7,936,338.

(30) Foreign Application Priority Data

Oct. 1, 2002 (JP) ................................. 2002-288803

(51) Int. Cl.
*G06F 1/16* (2006.01)
*G06F 3/041* (2006.01)
*G06F 3/0488* (2013.01)
*H01L 27/32* (2006.01)

(52) U.S. Cl.
CPC .......... *G06F 1/1643* (2013.01); *G06F 1/1626* (2013.01); *G06F 1/1652* (2013.01); *G06F 1/1692* (2013.01); *G06F 3/0418* (2013.01); *G06F 3/0488* (2013.01); *H01L 27/323* (2013.01); *Y10T 428/10* (2015.01)

(58) Field of Classification Search
CPC .... G06F 1/1626; G06F 1/1643; G06F 1/1692; G06F 1/1652; G06F 3/0418; G06F 3/0488; H01L 27/323; Y10T 428/10
USPC ........... 428/1.1, 1.5; 313/504; 345/173, 179, 345/183; 348/14.03; 349/122; 315/169.3
See application file for complete search history.

(56) References Cited

U.S. PATENT DOCUMENTS 2,744,562 A    5/1956  Larocca et al.
4,561,929 A   12/1985  Lenhardt
(Continued)

*Primary Examiner* — Sophie Hon
(74) *Attorney, Agent, or Firm* — Dentons US LLP

(57) ABSTRACT

A display unit which can realize reduction in thickness and weight of the display unit by omitting a void between a touch panel and a display panel, and its manufacturing method. Whole faces of the touch panel and the display panel are directly bonded together with an adhesive layer in between. The display panel has a structure wherein a driving substrate in which organic light emitting devices are formed and a sealing substrate are bonded together with an adhesive layer in between. The touch panel has a structure wherein a lower plastic film in which a transparent electrode is formed and a touch-side plastic film in which a transparent electrode is formed are layered so that the transparent electrodes are placed opposite. The display panel is constructed with only the driving substrate, and the organic light emitting devices are sealed by the touch panel instead of the sealing substrate. Therefore, thickness and weight of the display unit can be further reduced.

17 Claims, 8 Drawing Sheets

(56) References Cited

U.S. PATENT DOCUMENTS

| | | |
|---|---|---|
| 4,669,314 A | 6/1987 | Magrane |
| 4,931,782 A * | 6/1990 | Jackson .................. 345/174 |
| 4,958,148 A * | 9/1990 | Olson .................. H01H 13/702 |
| | | 178/18.01 |
| 5,548,306 A | 8/1996 | Yates, IV et al. |
| 5,667,624 A | 9/1997 | Akimoto et al. |
| 6,198,217 B1 | 3/2001 | Suzuki et al. |
| 6,221,194 B1 | 4/2001 | Watanabe et al. |
| 6,411,344 B2 | 6/2002 | Fujii et al. |
| 6,424,094 B1 | 7/2002 | Feldman |
| 6,559,595 B1 | 5/2003 | Inoue |
| 6,693,690 B2 | 2/2004 | Umemoto et al. |
| 6,707,450 B2 | 3/2004 | Ahn et al. |
| 6,771,327 B2 | 8/2004 | Sekiguchi |
| 6,781,642 B2 | 8/2004 | Nakanishi et al. |
| 6,814,642 B2 | 11/2004 | Siwinski et al. |
| 6,831,408 B2 * | 12/2004 | Hirano et al. .............. 313/504 |
| 6,835,950 B2 * | 12/2004 | Brown et al. .................. 257/40 |
| 6,879,319 B2 | 4/2005 | Cok |
| 6,914,640 B2 | 7/2005 | Yu |
| 7,034,457 B2 | 4/2006 | Iwase et al. |
| 7,042,444 B2 | 5/2006 | Cok |
| 7,071,927 B2 | 7/2006 | Blanchard |
| 2001/0053648 A1 | 12/2001 | Furukawa et al. |
| 2002/0024051 A1 * | 2/2002 | Yamazaki ............ H01L 27/322 |
| | | 257/79 |
| 2002/0122900 A1 * | 9/2002 | Ueda et al. .................... 428/1.1 |
| 2002/0125822 A1 * | 9/2002 | Graff .................. H01L 51/5256 |
| | | 313/506 |
| 2002/0130849 A1 | 9/2002 | Ahn et al. |
| 2002/0149572 A1 * | 10/2002 | Schulz .................. G06F 3/044 |
| | | 345/174 |
| 2003/0170492 A1 * | 9/2003 | Anderson et al. ............ 428/690 |
| 2003/0171060 A1 * | 9/2003 | Hirano et al. ................ 445/24 |
| 2003/0197197 A1 * | 10/2003 | Brown ............... H01L 51/5246 |
| | | 257/200 |
| 2004/0080267 A1 * | 4/2004 | Cok ............................ 313/512 |
| 2004/0188700 A1 * | 9/2004 | Fukasawa et al. ............ 257/100 |
| 2008/0136322 A1 * | 6/2008 | Kurotaki et al. ............. 313/504 |

* cited by examiner

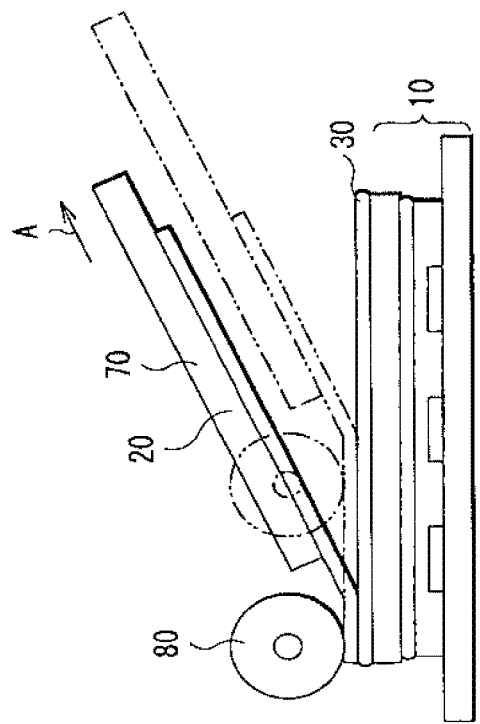
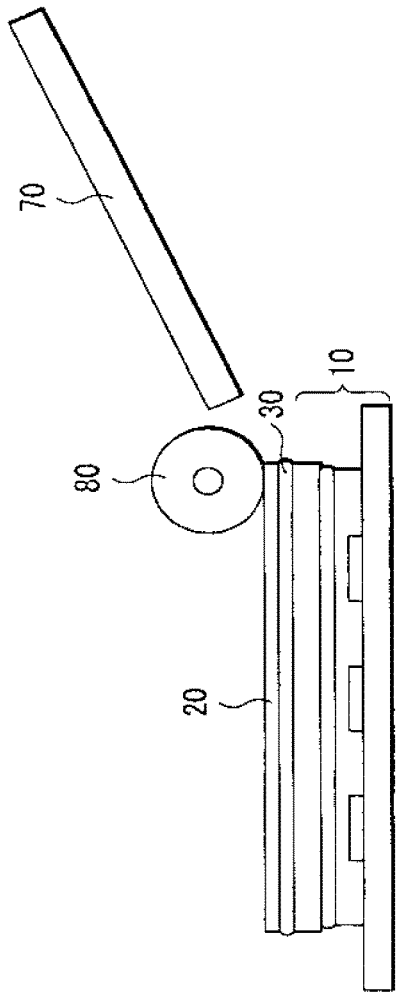
FIG. 6A
FIG. 6B

DISPLAY UNIT AND ITS MANUFACTURING METHOD

RELATED APPLICATION DATA

This application is a continuation of U.S. patent application Ser. No. 14/299,609 filed Jun. 9, 2014, which is a continuation of U.S. patent application Ser. No. 11/689,140, filed Mar. 21, 2007, now U.S. Pat. No. 8,808,477 issued on Aug. 19, 2014 which is a divisional of U.S. patent application Ser. No. 10/674,255, filed Sep. 29, 2003, which is now U.S. Pat. No. 7,936,338 issued on May 3, 2011, the entireties of all of which are incorporated herein by reference to the extent permitted by law. The present invention claims priority to Japanese Patent Application No. 2002-288803 filed in the Japanese Patent Office on Oct. 1, 2002, the entirety of which also is incorporated by reference herein to the extent permitted by law.

BACKGROUND OF THE INVENTION

1. Field of the Invention

The present invention relates to a display unit having a touch panel and its manufacturing method, and more particularly such a display unit using organic light emitting devices and its manufacturing method.

2. Description of the Related Art

A so-called touch screen, wherein a touch panel is mounted to a display panel using a CRT (Cathode Ray Tube) or a liquid crystal is widely used in banks, stations and the like. Additionally, a compact touch screen is adopted for a PDA (Personal Digital Assistant), a portable terminal and the like.

A general touch panel used for conventional touch screens is, for example, has a structure wherein a glass substrate and a plastic film are layered. In such a touch panel, a glass substrate side is placed opposite to a display panel, so that a plastic film side becomes an operation face. In the case of a liquid crystal display panel, in order to prevent blooming phenomenon that images are distorted since the liquid crystal is transformed by getting pressure from touch panel operations, a void is provided between a glass substrate of the touch panel and the liquid crystal display panel.

Lately, a touch panel having a structure wherein two plastic films are layered (hereinafter referred to as "flexible touch panel") has been developed, and this flexible touch panel is expected as what allows the PDA, the portable terminal and the like to become further thinner and lighter. However, such a flexible touch panel has no rigidity itself since it has no glass substrate, so that the flexible touch panel should be supported by bonding a display panel thereto. Therefore, there is a problem that the flexible touch panel cannot be provided with a void between itself and the display panel as in a touch screen of a conventional liquid crystal display panel, so that it is difficult to mount the flexible touch panel to the liquid crystal display panel.

To resolve the above problem, it is thinkable that a void is secured in the central part by fixing only four sides of the flexible touch panel on the display panel. In the case of taking such a measure for the conventional touch panel, when the plastic film is distorted or bent due to contact with a finger or a pen, distortion or bending can be restrained or recovered by the glass substrate. However, in the case of taking such a measure for the flexible touch panel, there is a problem that such distortion or bending cannot be restrained or recovered, and image quality may be lowered due to distortion or bending of the plastic film.

Meanwhile, it is thinkable to construct a touch screen by bonding the flexible touch panel to an organic light emitting display, instead of the liquid crystal display. However, so far, there has been a problem that there is no established technique by which the flexible touch panel can be bonded to a whole face of the organic light emitting display without distortion or bending of the plastic film.

Further, in a conventional organic light emitting display, a so-called can sealing structure is generally adopted. The can sealing structure is a structure wherein an adhesive is applied to the rim part of a rear panel, a sealing can made of metals or glass is bonded thereto, and a getter material such as calcium is enclosed in a space between the rear panel and the sealing can. In such an organic light emitting display having the can sealing structure, there is a problem that application to a touch screen of mobile devices particularly requiring high strength is difficult, since reducing thickness is limited and only four sides of the panel is fixed on the sealing can.

SUMMARY OF THE INVENTION

In light of the foregoing, it is a first object of the invention to provide a display unit which can realize reduction of its thickness and weight by omitting a void between a touch panel and a display panel, and its manufacturing method.

It is another object of the invention to provide a display unit which can improve image quality by preventing distortion or bending of the touch panel, and its manufacturing method.

A display unit according to the invention comprises a display panel including a substrate wherein display devices are formed; and a touch panel which is directly bonded to the whole face of the display panel with an adhesive layer in between, and which detects contact with a finger or a pen.

A method of manufacturing the display unit according to the invention includes the steps of; forming the display panel including the substrate wherein the display devices are formed; and directly bonding a whole face of the touch panel which detects contact with a finger or a pen and the display panel together with the adhesive layer in between.

In the display unit and its manufacturing method according to the invention, the whole faces of the touch panel and the display panel are directly bonded together with the adhesive layer in between. Therefore, there is no void between the touch panel and the display panel, so that a thickness of the display unit is reduced.

Here, it is preferable that the display panel has a sealing substrate which is placed opposite to a display device side of the substrate, and the whole faces of the substrate and the sealing substrate are bonded together with the adhesive layer in between. By doing this, strength of the display panel becomes high, leading to obtaining a display unit suitable for mobile devices, wherein a touch screen is essential and which requires high strength.

A suitable touch panel is, for example, a touch panel having a structure wherein two plastic films in which respective transparent electrodes are formed are layered so that the transparent electrodes are placed opposite to each other. The reason of it is that thickness and weight of the display unit is further reduced. Another reason of it is that even when the touch panel is such a touch panel with low rigidity, the touch panel is supported by the display panel, so that when distortion or bending is generated in the plastic film due to contact with a finger or a pen, such distortion or bending is restrained or recovered by the display panel.

Further, a suitable display device is an organic light emitting device, which has an organic layer including a light emitting layer between a first electrode and a second electrode, and which extracts lights generated in the light emitting layer from the second electrode side. In the structure of the invention, the touch panel and the display panel are directly bonded without providing a void between the touch panel and the display panel since the organic light emitting device has no blooming phenomenon as in the liquid crystal. Therefore, by the structure of the invention, high image quality can be realized.

Other and further objects, features and advantages of the invention will appear more fully from the following description.

BRIEF DESCRIPTION OF THE DRAWINGS

FIGS. 6A and 6B are explanation drawings showing a process following FIG. 5;

DETAILED DESCRIPTION OF THE PREFERRED EMBODIMENTS

Embodiments of the invention will be described in detail hereinbelow with reference to the drawings.
[First Embodiment]

Figure 1:
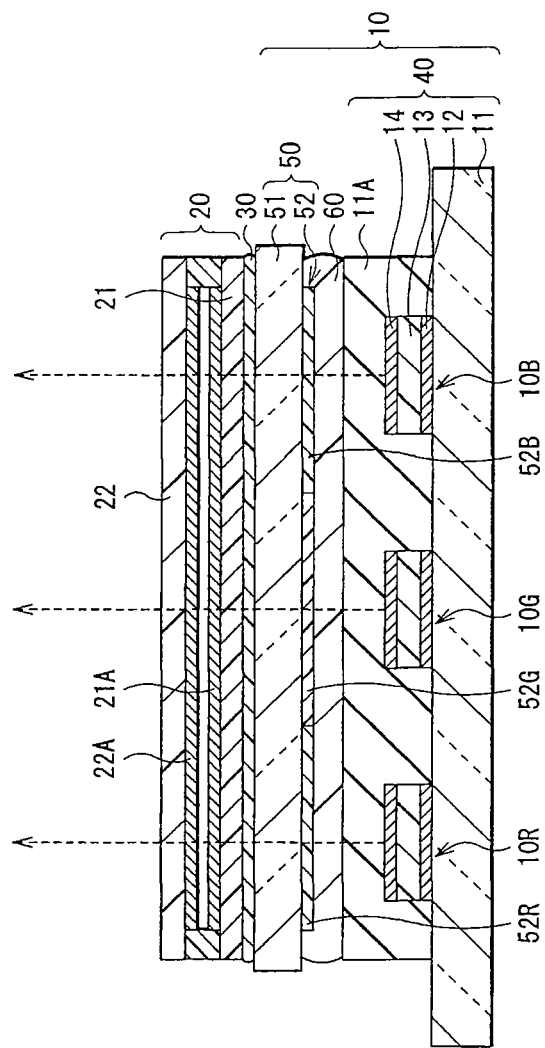
FIG. 1 is a cross sectional view showing a construction of a display unit according to a first embodiment of the invention.

FIG. 1 shows a cross sectional structure of a display unit according to a first embodiment of the invention. This display unit is used as an ultrathin organic light emitting color display unit or the like, and, for example, a touch panel 20 is bonded to a whole face of a display panel 10 by an adhesive layer 30.

In the display panel 10, for example, a driving panel 40 and a sealing panel 50 are placed opposite, and whole faces of both the panels 40 and 50 are bonded by an adhesive layer 60.

The driving panel 40 has a structure wherein, for example, an organic light emitting device 10R which emits red lights, an organic light emitting device 10G which emits green lights, and an organic light emitting device 10B which emits blue lights are provided in order in a matrix state as a whole, on a driving substrate 11 made of an insulating material such as glass. In addition, the driving substrate 11 is provided with a protective film (passivation film) 11A to prevent moisture and the like from intruding into the organic light emitting devices 10R, 10G, and 10B.

In the organic light emitting devices 10R, 10G, and 10B, for example, a first electrode 12 as an anode, an organic layer 13, and a second electrode 14 as a cathode are layered in this order from the driving substrate 11 side. On the second electrode 14, the protective film 11A is formed.

The first electrode 12 also has a function as a reflection layer, and it is desirable that the first electrode 12 has a reflectance as high as possible in order to improve light emitting efficiency. For example, materials to make the first electrode 12 include simple substances or alloys of metal elements with high work function, such as platinum (Pt), gold (Au), silver (Ag), chromium (Cr), tungsten (W) and the like. A thickness of the first electrode 12 in the layer direction (hereinafter simply referred to as "thickness") is preferably from 100 nm to 300 nm. As an alloy material, for example, AgPdCu alloy, whose main component is silver, and which contains palladium (Pd) of 0.3 wt % to 1 wt % and copper (Cu) of 0.3 wt % to 1 wt % can be cited.

Figure 2:
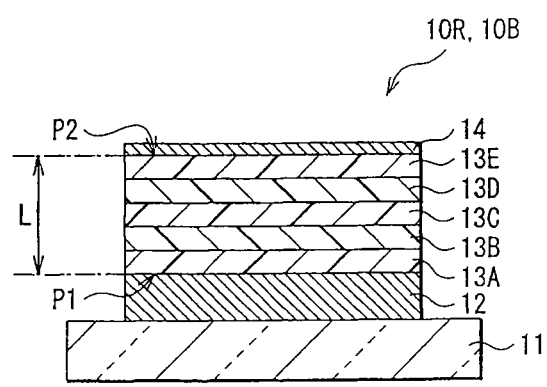
FIG. 2 is an enlarged cross sectional view showing a construction of an organic layer in organic light emitting devices illustrated in FIG. 1.

A construction of the organic layer 13 varies according to light emitting colors of the organic light emitting device 10. FIG. 2 shows an enlarged view of a construction of the organic layer 13 in the organic light emitting devices 10R and 10B. The organic layer 13 of the organic light emitting devices 10R and 10B has a structure wherein an electron hole injection layer 13A, an electron hole transport layer 13B, a light emitting layer 13C, an electron transport layer 13D, and an electron injection layer 13E are layered in this order from the first electrode 12 side. A function of the electron hole injection layer 13A and the electron hole transport layer 13B is to improve efficiency to inject electron holes into the light emitting layer 13C. A function of the light emitting layer 13C is to produce lights by current injection. A function of the electron transport layer 13D and the electron injection layer 13E is to improve efficiency to inject electrons into the light emitting layer 13C.

The electron hole injection layer 13A of the organic light emitting device 10R, for example, has a thickness of about 30 nm, and made of 4,4', 4"-tris(3-methylphenyl phenyl amino)tri-phenyl amine (MTDATA). The electron hole transport layer 13B of the organic light emitting device 10R, for example, has a thickness of about 30 nm, and made of bis[(N-naphthyl)-N-phenyl]benzidine (α-NPD). The light emitting layer 13C of the organic light emitting device 10R, for example, has a thickness of about 50 nm, and made of 2,5-bis[4-[N-(4-methoxyphenyl)-N-phenylamino]]stilbenzene-1,4-dica-bonitrile (BSB). The electron transport layer 13D of the organic light emitting device 10R, for example, has a thickness of about 30 nm, and made of 8-quinolinol aluminum complex (Alq). The electron injection layer 13E of the organic light emitting device 10R, for example, has a thickness of 1 nm, and made of lithium fluoride (LiF).

The electron hole injection layer 13A of the organic light emitting device 10B, for example, has a thickness of about 30 nm, and made of MTDATA. The electron hole transport layer 13B of the organic light emitting device 10B, for example, has a thickness of about 30 nm, and made of α-NPD. The light emitting layer 13C of the organic light emitting device 10B, for example, has a thickness of about 30 nm, and made of spiro 6 Φ. The electron transport layer 13D of the organic light emitting device 10B, for example, has a thickness of about 30 nm, and made of Alq. The electron injection layer 13E of the organic light emitting device 10B, for example, has a thickness of about 1 nm, and made of lithium fluoride (LiF).

Figure 3:
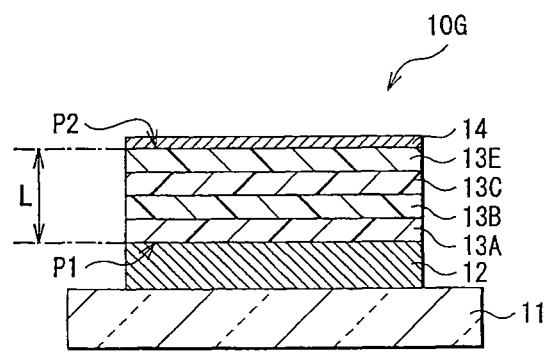
FIG. 3 is an enlarged cross sectional view showing a construction of an organic layer in an organic light emitting device illustrated in FIG. 1.

FIG. 3 shows an enlarged view of a construction of the organic layer 13 in the organic light emitting device 10G. The organic layer 13 of the organic light emitting device 10G has a structure wherein the electron hole injection layer 13A, the electron hole transport layer 13B, the light emitting layer 13C, and the electron injection layer 13E are layered in this order from the first electrode 12 side. The light emitting layer 13C also has a function as an electron transport layer.

The electron hole injection layer 13A of the organic light emitting device 10G, for example, has a thickness of about 30 nm, and made of MTDATA. The electron hole transport layer 13B of the organic light emitting device 10G, for example, has a thickness of about 30 nm, and made of α-NPD. The light emitting layer 13C of the organic light emitting device 10G, for example, has a thickness of about 60 nm, and made of Alq. The electron injection layer 13E of the organic light emitting device 10G, for example, has a thickness of about 1 nm, and made of lithium fluoride (LiF).

The second electrode 14 shown in FIGS. 1 to 3, for example, has a thickness of 1 nm to 50 nm, and made of a simple substance or an alloy of metal elements with low work function, such as aluminum (Al), magnesium (Mg), calcium (Ca), sodium (Na) and the like. Specially, an alloy made of magnesium and silver (MgAg alloy) is preferable, and a mass ratio of magnesium and silver is preferably Mg:Ag=5:1 to 20:1.

The second electrode 14 also has a function as a semi-transparent reflection layer. Namely, these organic light emitting devices 10R, 10G, and 10B have a resonator structure wherein lights generated in the light emitting layer 13C are resonated and extract from a second end P2, by regarding an end face of the first electrode 12 on the light emitting layer 13C side as a first end P1, an end face of the second electrode 14 on the light emitting layer 13C side as the second end P2, and the organic layer 13 as a resonance part. Such a resonator structure is preferable, since the lights generated in the light emitting layer 13C generate multiple interference, and act as a kind of narrow band filter, so that half bandwidth of spectrum of the extracted light is reduced, and color purity can be improved. Further, such a resonator structure is preferable, since outside lights entering from the sealing panel 50 can be attenuated by the multiple interference as well, and reflectance of outside lights in the organic light emitting devices 10R, 10G, and 10B can be lowered extremely in combination with a color filter 52 described later (refer to FIG. 1).

To obtain the above effects, it is preferable that an optical distance L between the first end P1 and the second end P2 of the resonator satisfies Mathematical Expression 1, and a resonance wave length of the resonator (peak wave length of the spectrum of the extracted light) corresponds to a peak wave length of spectrum of the light to be extracted. Actually, it is preferable that the optical distance L is selected so that L becomes a positive minimum value which satisfies the Mathematical Expression 1.

$$(2L)/\lambda + \Phi/(2\pi) = m \qquad \text{[Mathematical Expression 1]}$$

(In the mathematical expression, L represents an optical distance between the first end P1 and the second end P2, Φ represents a phase shift (rad) of the reflection light generated in the first end P1 and the second end P2, λ represents a peak wave length of spectrum of the light to be extracted from the second end P2 side, and m represents a whole number which makes L be a positive number. In the Mathematical Expression 1, L and λ should share a common unit such as (nm).)

The sealing panel 50 shown in FIG. 1 has a sealing substrate 51 which seals the organic light emitting devices 10R, 10G, and 10B along with the adhesive layer 60. The sealing substrate 51 is made of a material such as glass which is transparent to the lights generated in the organic light emitting devices 10R, 10G, and 10B. The sealing substrate 51 is, for example, provided with the color filter 52, extracts the lights generated in the organic light emitting devices 10R, 10G, and 10B, absorbs outside lights reflected in the organic light emitting devices 10R, 10G, and 10B and the wiring between them, and improves the contrast.

The color filter 52 can be arranged on either face of the sealing substrate 51. However, it is preferable to arrange the color filter 52 on the driving panel 40 side. The reason of it is that the color filter 52 is not exposed on the surface and a structure wherein antiweatherability of the color filter 52 is considered can be obtained. Another reason of it is that when bonding the display panel 10 and the touch panel 20, problems such as unevenness in the touch panel 20 can be prevented. The color filter 52 has a red color filter 52R, a green filter 52G, and a blue filter 52B, which are positioned corresponding to the organic light emitting devices 10R, 10G, and 10B in this order.

The red color filter 52R, the green filter 52G, and the blue filter 52B are, for example, respectively formed in the shape of rectangle with no space between them. The red color filter 52R, the green filter 52G, and the blue filter 52B are respectively made of a resin mixed with pigments, and adjusted so that light transmission in the targeted wave length band of red, green or blue becomes high and light transmission in other wave length band becomes low by selecting a pigment.

Further, a wave length range with high light transmittance in the color filter 52 corresponds to a peak wave length λ of spectrum of the light extracted from the resonator structure. Therefore, out of outside lights entering from the sealing panel 50, only the light having a wave length equal to the peak wave length λ of spectrum of the light to be extracted filters out through the color filter 52, and other outside lights having other wave lengths are prevented from intruding into the organic light emitting devices 10R, 10G, and 10B.

The protective film 11A shown in FIG. 1 is made of, for example, silicon oxide ($SiO_2$), silicon nitride ($SiN_x$) and the like. A function of the protective film 11A is to prevent oxygen, moisture and the like from intruding into the organic light emitting devices 10R, 10G, and 10B.

The touch panel 20 shown in FIG. 1 is a flexible touch panel which has a structure, for example, wherein a lower plastic film 21 and a touch-side plastic film 22 are layered with an unshown spacer in between, and located on the sealing substrate 51 on the side opposite to the driving substrate 11. In order to detect contact to the touch-side plastic film 22 by a finger, a pen or the like, in this touch panel 20, for example, the lower plastic film 21 is provided with a transparent electrode 21A, and the touch-side plastic film 22 is provided with a transparent electrode 22A. The lower plastic film 21 and the touch-side plastic film 22 are layered so that the transparent electrodes 21A and 22A are placed opposite. The transparent electrodes 21A and 22A are connected to an unshown control system through an unshown flexible connector and the like.

This display unit can be, for example, produced as follows.

Figure 4A:
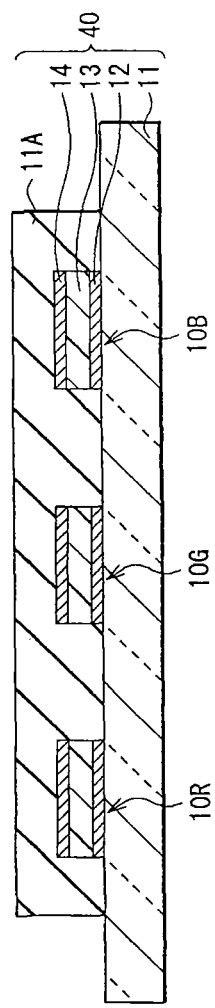
FIGS. 4A and 4B are cross sectional views showing a method of manufacturing the display unit illustrated in FIG. 1 in the order of processes.

FIGS. 4A and 4B to 6A and 6B show a method of manufacturing this display unit in the order of processes. First, as shown in FIG. 4A, on the driving substrate 11 made of the above-mentioned material, the first electrode 12 made of the above-mentioned material is deposited in the foregoing thickness by, for example, DC sputtering, selective etching is made by using, for example, lithography technique, and patterning is made in the form of a given shape. After that, as shown in FIG. 4A, the electron hole injection layer 13A, the electron hole transport layer 13B, the light emitting layer 13C, the electron transport layer 13D, the electron injection layer 13E, and the second electrode 14 which have the foregoing thicknesses and are made of the foregoing materials, are sequentially deposited, for example, by deposition method, and the organic light emitting devices 10R, 10G, and 10B as shown in FIGS. 2 and 3 are formed. After that, as shown in FIG. 4A as well, the protective film 11A made of the above-mentioned material is formed to cover the organic light emitting devices 10R, 10G, and 10B of the driving substrate 11. Consequently, the driving panel 40 is formed.

Figure 4B:
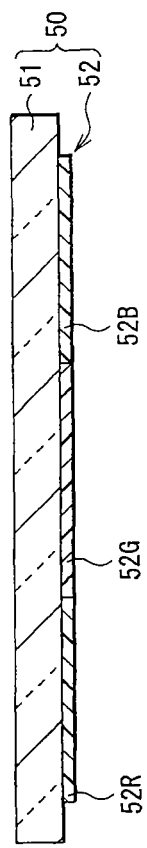

As shown in FIG. 4B, the red filter 52R is formed by, for example, on the sealing substrate 51 made of the foregoing material, a material for the red filter 52R is applied by spin coat method, and burning is made with patterning by photolithography. Subsequently, as shown in FIG. 4B as well, the blue filter 52B and the green filter 52G are sequentially formed in the same manner as in the red filter 52R. Consequently, the sealing panel 50 is formed.

Figure 5:
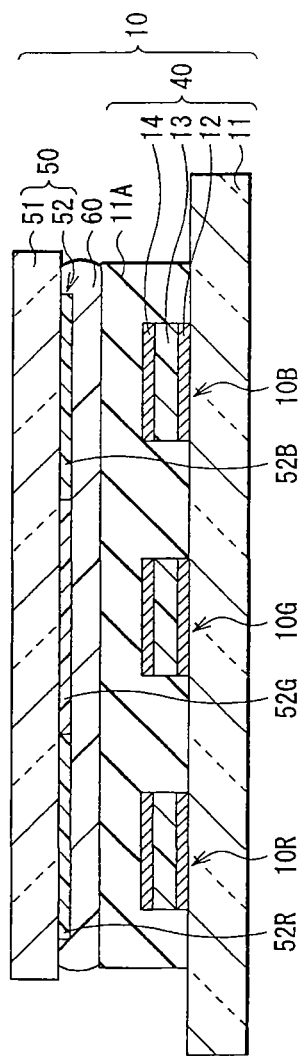
FIG. 5 is a cross sectional view showing a process following FIGS. 4A and 4B.

Subsequently, as shown in FIG. 5, the adhesive layer 60 is formed on the protective film 11A, the sealing substrate 51 wherein the color film 52 is formed is placed opposite to the side of the organic light emitting devices 10R, 10G, and 10B of the driving substrate 11, and whole faces of the sealing substrate 51 and the driving substrate 11 are bonded with the adhesive layer 60 in between. Then, it is preferable that a side of the sealing panel 50 where the color filter 52 is formed is placed opposite to the driving panel 40. Consequently, the display panel 10 is formed.

After that, as shown in FIGS. 6A and 6B, the adhesive layer 30 is formed on the display panel 10, and the whole faces of the touch panel 20 and the display panel 10 are bonded with the adhesive layer 30 in between. Then, first, as shown in FIG. 6A, the touch panel 20 is attached to a touch panel holding plate 70, and a roller 80 is applied onto one side of the touch panel 20. Subsequently, as shown in FIG. 6B, the touch panel 20 and the display panel 10 are bonded by pressure force generated by rotational movement of the roller 80. Then, the touch panel 20 is slid on the touch panel holding plate 70 by moving the touch panel holding plate 70 in the direction of arrow A in sync with the roller 80. Consequently, the touch panel 20 and the display panel 10 can be bonded together without mixing air bubbles into the adhesive layer 30. As above, the display unit shown in FIGS. 1 to 3 is completed.

In this display unit, when a given voltage is applied between the first electrode 12 and the second electrode 14, current is injected into the light emitting layer 13C, and an electron hole and an electron recombines, leading to light emitting mainly at the interface of the light emitting layer 13C. This light multiple-reflects between the first electrode 12 and the second electrode 14, and extracted through the second electrode 14, the protective film 11A, the color filter 52, the sealing substrate 51, and the touch panel 20. When a finger or a pen contacts the touch-side plastic film 22, the touch panel 20 detects the contact. Then, in this embodiment, since the whole faces of the touch panel 20 and the display panel 10 are directly bonded together with the adhesive layer 30 in between so that the touch panel 20 is supported by the display panel 10, even when a finger or a pen contacts the touch panel 20, no distortion or bending is generated in the touch panel 20, and image quality is improved.

As above, according to this embodiment, since the whole faces of the touch panel 20 and the display panel 10 are directly bonded with the adhesive layer 30 in between, a void between the touch panel 20 and the display panel 10 is omitted, and a thickness of the display unit can be reduced.

In particular, since the display panel 10 has a structure wherein the whole faces of the driving substrate 11 and the sealing substrate 51 are bonded together with the adhesive layer 60 in between, strength of the display panel 10 is raised. Therefore, this display unit is very suitable as a display unit for mobile devices wherein a touch screen is essential and which require high strength.

Further, the touch panel 20 is a flexible touch panel having the structure, wherein the lower plastic film 21 formed with the transparent electrode 21A and the touch-side plastic film 22 formed with the transparent electrode 22A are layered so that the transparent electrodes 21A and 22A are placed opposite. Therefore, thickness and weight of the display unit can be further reduced. Further, even if the touch panel 20 is such a touch panel with low rigidity, since the touch panel 20 is supported by the display panel 10, when distortion or bending is generated in the touch-side plastic film 22 and the like due to contact with a finger or a pen, such distortion or bending can be restrained or recovered by the display panel 10.

In addition, particularly, since when the touch panel 20 and the display panel 10 are bonded together with the adhesive layer 30 in between, the roller 80 is applied onto one side of the touch panel 20 and pressure force is applied by rotating and moving the roller 80, the touch panel 20 and the display panel 10 can be bonded without mixing air bubbles into the adhesive layer 30. Consequently, deterioration of the organic light emitting devices 10R, 10G, and 10B due to oxygen or moisture of air bubbles can be prevented, and the image quality can be improved.

[Modification]

Figure 7A:
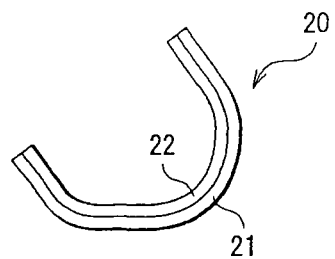
FIGS. 7A to 7C are explanation drawings showing a method of manufacturing a display unit according to a modification of the invention.
Figure 7B:
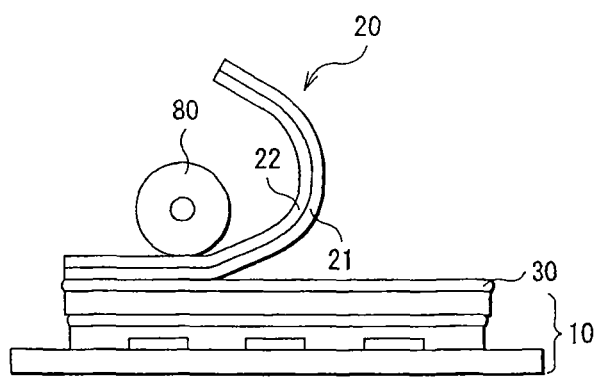

FIGS. 7A and 7B show modification of the method of manufacturing the display unit according to the first embodiment. In this modification, the touch panel 20 is previously incurved by setting the face bonded to the adhesive layer 30 to outside, and pressed by the roller 80 from the other face.

First, in the same manner as in what shown in FIGS. 4A, 4B and 5 in the first embodiment, the display panel 10 is formed. Subsequently, as shown in FIG. 7A, the touch panel 20 is previously incurved in the shape of, for example, approximate U, by setting the lower plastic film 21 bonded to the adhesive layer 30 to outside and by using a roll (not shown) and the like.

Next, as shown in FIG. 7B, the adhesive layer 30 is formed on the display panel 10, one end 20A of the touch panel 20 which is previously incurved in the shape of U is placed on the display panel 10, and the roller 80 is applied to the one end 20A. Then, the roller 80 is applied to the touch-side plastic film 22 of the touch panel 20.

Figure 7C:
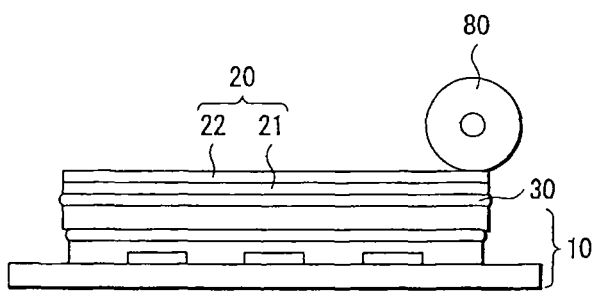

Subsequently, as shown in FIG. 7C, the touch panel 20 and the display panel 10 are bonded together by pressing the touch panel 20 by the roller 80 from the touch-side plastic film 22 side by rolling and moving the roller 80. In this way, force is applied in the direction of tension to make the touch-side plastic film 22 flat. Therefore, in bonding and operation, no distortion or bending is generated in the touch-side plastic film 22. As above, the display unit shown in FIGS. 1 to 3 is completed.

As above, in this modification, since the touch panel 20 is previously incurved by setting the lower plastic film 21 bonded to the adhesive layer 30 to outside, and the touch panel 20 and the display panel 10 are bonded by pressing the touch panel 20 by the roller 80 from the touch-side plastic film 22 side, force is applied in the direction of tension to make the touch-side plastic film 22 of the touch panel 20 flat. Therefore, in bonding and operation, no distortion or bending is generated in the touch-side plastic film 22, and image quality is improved.

[Second Embodiment]

Figure 8:
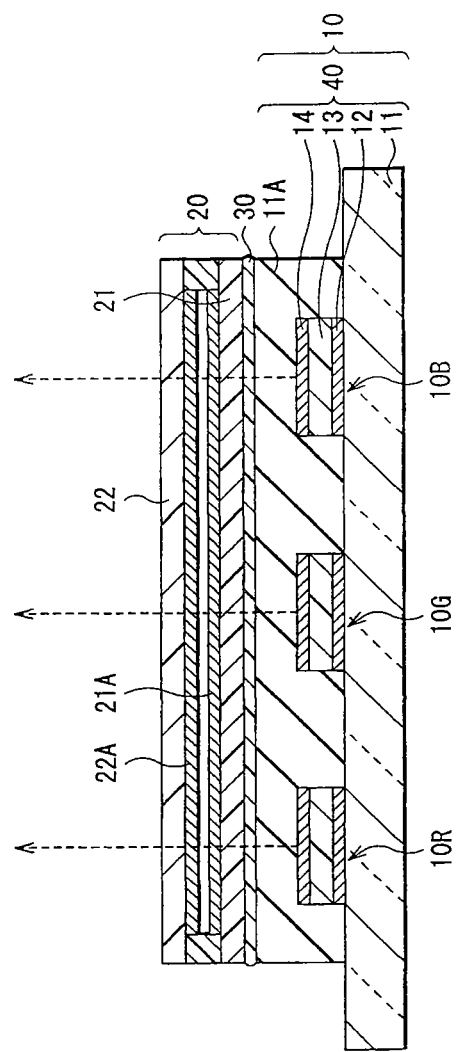
FIG. 8 is a cross sectional view showing a construction of a display unit according to a second embodiment of the invention.

FIG. 8 shows a cross sectional structure of a display unit according to a second embodiment of the invention. This display unit is identical with the display unit described in the first embodiment except that the display panel 10 is not provided with the sealing panel 50 and the adhesive layer 60, but is comprised of only the driving panel 40. Therefore, the same components are applied with the same symbols, and their detailed explanations are omitted.

The touch panel 20 is bonded on the whole face on the side where the organic light emitting devices 10R, 10G, and 10B of the driving substrate 11 are formed with the adhesive layer 30 in between. The light emitting devices 10R, 10G, and 10B are sealed by the touch panel 20. Therefore, since the sealing panel 50 (refer to FIG. 1) and the adhesive layer 60 are omitted, thickness and weight of the display unit can be further reduced. Additionally, since the organic light emitting devices 10R, 10G, and 10B are surely sealed by the protective film 11A, the adhesive layer 30, and the touch panel 20, deterioration due to intrusion of moisture or oxygen can be prevented.

A method of manufacturing the display unit in this embodiment is similar to that in the first embodiment except that the touch panel 20 and the display panel 10 are bonded together by forming the adhesive layer 30 on the protective film 11A. Its function is similar to that in the first embodiment.

As above, in this embodiment, since the sealing panel 50 is not provided, and the organic light emitting devices 10R, 10G, and 10B are sealed by the touch panel 20, thickness and weight of the display unit can be further reduced. Additionally, since the organic light emitting devices 10R, 10G, and 10B are surely sealed by the protective film 11A, the adhesive layer 30, and the touch panel 20, deterioration due to intrusion of moisture or oxygen can be prevented.

While the invention has been described with reference to the embodiments, the invention is not limited to the foregoing embodiments, and various modifications may be made. For example, materials, thickness, deposition methods, and deposition conditions for respective layers are not limited to those described in the foregoing embodiments, and other materials, thickness, deposition methods, and deposition conditions can be applied.

Figure 9A:
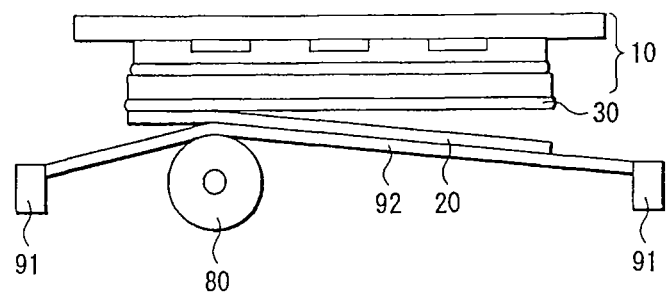
FIGS. 9A and 9B are explanation drawings showing a method of manufacturing the display unit according to the modification of the invention.
Figure 9B:
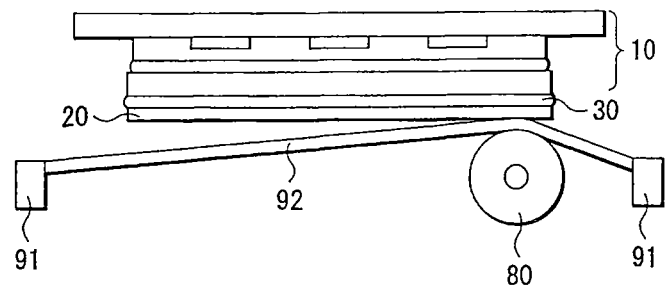

For example, in the foregoing first embodiment, the touch panel 20 is attached to the touch panel holding plate 70. However, it is possible that, as shown in FIGS. 9A and 9B, instead of the touch panel holding plate 70, the touch panel 20 is attached to a mesh 92 which is stretched between frames 91, and pressed by the roller 80 through the mesh 92. This method is preferable since an angle of bend of the touch panel 20 is small so that a load to the touch panel 20 becomes small.

Further, in the foregoing second embodiment, the case using the touch panel 20 having the structure wherein the lower plastic film 21 and the touch-side plastic film 22 are layered has been described. However, in the case where the sealing panel 50 is omitted as above, the conventional touch panel using a glass substrate instead of the lower plastic film 21 can be used in order to improve strength of the display unit.

Further, the foregoing modification can be applied not only to the first embodiment, but also to the second embodiment. It is hereby possible to realize a more thinner and lighter display unit.

Further, for example, for the touch panel 20, various driving methods can be used, such as resistance film method, capacitance method, optical method, ultrasonic method, and electromagnetic induction method.

Further, for example, regarding a structure of the organic light emitting devices 10R, 10G, and 10B, their layer order can be opposite to that in the foregoing embodiments in such a way that the second electrode 14, the organic layer 13, and the first electrode 12 are layered on the driving substrate 11 in this order from the driving substrate 11, and lights can be extracted from the driving substrate 11 side. In this case, the touch panel 20 is placed on the driving substrate 11 on the side opposite to the organic light emitting devices 10R, 10G, and 10B.

Further, for example, in the foregoing embodiments, the case using the first electrode 12 as an anode and the second electrode 14 as a cathode has been described. However, it is possible that anode and cathode are reversed in such a way that the first electrode 12 is a cathode and the second electrode 14 is an anode. Further, it is possible, along with using the first electrode 12 as a cathode and the second electrode 14 as an anode, the second electrode 14, the organic layer 13, and the first electrode 12 are layered on the driving substrate 11 in this order from the driving substrate 11 side, and the lights are extracted from the driving substrate 11 side.

Further, in the foregoing embodiments, the structures of the organic light emitting devices have been specifically described. However, all layers are not necessarily provided, and other layer can be further provided. For example, it is possible that the first electrode 12 has a two-layer structure wherein a transparent conductive film is layered on the top of a reflection film such as a dielectric multi-layer film or Al. In this case, an end face of the reflection film on the light emitting layer side composes an end of the resonation part, and the transparent conductive film composes a part of the resonation part.

Further, in the foregoing embodiments, the case wherein the second electrode 14 is comprised of the semi-transparent reflection layer has been described. However, it is possible that the second electrode 14 has a structure wherein the semi-transparent reflection layer and a transparent electrode are layered from the first electrode 12 side. A function of this transparent electrode is to lower electric resistance of the semi-transparent reflection layer. This transparent electrode is made of a conductive material having a sufficient translucency to the lights generated in the light emitting layer. As a material to make the transparent electrode, for example, ITO or a compound containing indium, zinc (Zn), and oxygen is preferable, since good conductivity can be obtained by using these materials even if deposition is made at room temperature. A thickness of the transparent electrode can be, for example, 30 nm to 1,000 nm.

Further, in the foregoing embodiments, the case wherein the organic light emitting devices 10R, 10G, and 10B are formed on the driving substrate 11 has been described. However, this invention can be applied to a display wherein other display devices such as an inorganic electroluminescence device is formed on the driving substrate 11, FED (Field Emission Display), or a paper-like display which has been noted lately.

As described above, according to the display unit of the invention or the method of manufacturing the display unit of the invention, since the whole faces of the touch panel and the display panel are directly bonded together with the adhesive layer in between, a void between the touch panel and the display panel can be omitted and a thickness of the display unit can be reduced.

According to the display unit of one aspect of the invention or the method of manufacturing the display unit of one aspect of the invention, since the display panel has the sealing substrate which is placed opposite to the display device side of the substrate, and the whole faces of the substrate and the sealing substrate are bonded together with the adhesive layer in between, strength of the display panel is improved. Therefore, this display unit is extremely suitable as a display unit for mobile devices wherein a touch screen is essential and which require high strength.

According to the display unit of another aspect of the invention or the method of manufacturing the display unit of another aspect of the invention, since the touch panel has a structure wherein two plastic films wherein respective transparent electrodes are formed are layered so that these transparent electrodes are placed opposite to each other, thickness and weight of the display unit is further reduced. In addition, even if the touch panel is such a touch panel with low rigidity, the touch panel is supported by the display panel. Thus, when distortion or bending is generated in the plastic film due to contact with a finger or a pen, such distortion or bending is restrained or recovered by the display panel.

According to the display unit of still another aspect of the invention or the method of manufacturing the display unit of still another aspect of the invention, since the touch panel is provided on the side where the display devices of the substrate are formed, and the display devices are sealed by the touch panel, thickness and weight of the display unit can be further reduced. In addition, since the display devices are surely sealed by the adhesive layer and the touch panel, deterioration can be prevented.

According to the method of manufacturing the display unit of still another aspect of the invention, since when the touch panel and the display panel are bonded together with the adhesive layer in between, one side of the touch panel is applied to the roller, and pressure force is applied by rotational movement of the roller, the touch panel and the display panel can be bonded together without mixing air bubbles into the adhesive layer. Therefore, deterioration of the display devices due to oxygen or moisture of air bubbles can be prevented, and image quality can be improved.

According to the method of manufacturing the display unit of still another aspect of the invention, since when the touch panel is pressed by the roller, the touch panel is previously incurved by setting the face bonded to the adhesive layer to outside, and the touch panel is pressed by the roller from the other face, i.e. the side to which contact by a finger or a pen is made, force is applied in the direction of tension to make the face to which contact by a finger or a pen is made flat. Therefore, in bonding, no distortion or bending is generated in the face to which contact by a finger or a pen is made, and image quality is improved.

Obviously many modifications and variations of the present invention are possible in the light of the above teachings. It is therefore to be understood that within the scope of the appended claims the invention may be practiced otherwise than as specifically described.

What is claimed is:

1. A display unit, comprising:
   (a) a display panel substrate;
   (b) a plurality of display devices formed on the display panel substrate;
   (c) a protective film formed directly on the plurality of display devices, and across a whole face of the display panel substrate, sealing the plurality of display devices;
   (d) an adhesive member formed directly on the protective film, and across a whole face of the display panel substrate, sealing the plurality of display devices; and
   (e) a flexible touch panel with facing first and second touch panel plastic films, the first touch panel plastic film being directly disposed on the adhesive member, and bonded across a whole face of the display panel substrate by the adhesive member, sealing the plurality of display devices;
   wherein,
   the plurality of the display devices are configured to emit light through the touch panel,
   each of the plurality of the display devices has a resonator structure which functions as a narrow band filter and includes (i) a first electrode, (ii) a second electrode, and (iii) an organic light emitting layer disposed between the first electrode and the second electrode,
   lights generated in the light emitting layer are resonated and extracted from an end face of the electrode on the light emitting layer side, the first and second electrodes composing parts of the resonator structure, and
   the plurality of the display devices are wholly sealed by the protective film, the adhesive member, and the touch panel.

2. The display unit according to claim 1, wherein the first touch panel plastic film carries a first transparent electrode.

3. The display unit according to claim 2, wherein the second touch panel plastic film carries a second transparent electrode.

4. The display unit of claim 1, wherein both the first touch panel plastic film and the second touch panel plastic film, carry transparent electrodes.

5. The display unit of claim 1, wherein there are no air bubbles mixed into the adhesive member.

6. A display unit comprising:
   (a) a display panel substrate;
   (b) a plurality of display devices formed on the display panel substrate;
   (c) a protective film formed directly on the plurality of display devices, and across a whole face of the display panel substrate, sealing the plurality of display devices;
   (d) a flexible touch panel comprising facing first and second touch panel plastic films; and
   (e) an adhesive member disposed between the display panel substrate and the first touch panel plastic film, the adhesive member being directly in contact with each of a whole face of the protective film and a whole face of the first touch panel plastic film, the first touch panel plastic film being bonded across a whole face of the display panel substrate by the adhesive member, sealing the plurality of display devices;
   wherein,
   the plurality of the display devices are configured to emit light through the touch panel,
   at least one of the display devices includes (i) an anode electrode, (ii) a cathode electrode, and (iii) an organic light emitting layer disposed between the anode electrode and the cathode electrode, lights generated in the light emitting layer are resonated and extracted from the anode electrode or the cathode electrode on the light emitting layer side, the anode electrode and the cathode electrode composing parts of a resonator structure, and the plurality of display devices are wholly sealed by the protective film, the adhesive member, and the touch panel.

7. The display unit according to claim 6, wherein the anode electrode has a thickness from 100 nm to 300 nm, both inclusive.

8. The display unit according to claim 6, wherein the cathode electrode has a thickness from 1 nm to 50 nm, both inclusive.

9. The display unit according to claim 6, wherein:
the anode electrode has a thickness from 100 nm to 300 nm, both inclusive, and
the cathode electrode has a thickness from 1 nm to 50 nm, both inclusive.

10. The display unit according to claim 9, wherein the protective film includes silicon oxide.

11. The display unit according to claim 9, wherein the protective film includes silicon nitride.

12. The display unit according to claim 9, wherein the protective film is formed directly on both the display panel substrate and the plurality of display devices.

13. The display unit according to claim 9, wherein the first touch panel plastic film carries a transparent electrode.

14. The display unit according to claim 13, the second touch panel plastic film carries a transparent electrode.

15. The display unit of claim 9, wherein both the first touch panel film and the second touch panel plastic film carry transparent electrodes.

16. The display unit of claim 6, wherein:
the anode electrode includes silver, and
the cathode electrode includes an alloy made of magnesium and silver.

17. The display unit of claim 6, wherein:
the anode electrode is a reflective layer, and
the cathode electrode is a semi-transparent reflective layer.

* * * * *